(12) United States Patent
Wang et al.

(10) Patent No.: US 8,294,197 B2
(45) Date of Patent: Oct. 23, 2012

(54) PROGRAM/ERASE SCHEMES FOR FLOATING GATE MEMORY CELLS

(75) Inventors: Ming-Tsong Wang, Taipei (TW); Tong-Chern Ong, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 309 days.

(21) Appl. No.: 11/525,351

(22) Filed: Sep. 22, 2006

(65) Prior Publication Data

US 2008/0073689 A1 Mar. 27, 2008

(51) Int. Cl.
*H01L 29/788* (2006.01)
*H01L 29/792* (2006.01)

(52) U.S. Cl. ........ 257/319; 257/314; 257/315; 257/316; 257/324; 257/E29.3; 257/E29.309

(58) Field of Classification Search .......... 257/314–316, 257/319, 321, 324, E29.3–E29.306, E29.309
See application file for complete search history.

(56) References Cited

U.S. PATENT DOCUMENTS

| | | | |
|---|---|---|---|
| 5,364,806 A * | 11/1994 | Ma et al. | 438/266 |
| 5,596,214 A | 1/1997 | Endo | |
| 6,031,263 A * | 2/2000 | Forbes et al. | 257/315 |
| 6,617,639 B1 * | 9/2003 | Wang et al. | 257/324 |
| 6,709,928 B1 | 3/2004 | Jenne et al. | |
| 6,933,218 B1 | 8/2005 | Lee et al. | |
| 6,949,804 B2 | 9/2005 | Miyazaki | |
| 6,958,513 B2 | 10/2005 | Wang | |
| 7,112,539 B2 | 9/2006 | Lee et al. | |
| 7,372,098 B2 | 5/2008 | Forbes | |
| 7,420,256 B2 | 9/2008 | Chae et al. | |
| 7,579,646 B2 | 8/2009 | Wang et al. | |
| 7,763,927 B2 | 7/2010 | Wu et al. | |
| 7,879,738 B2 | 2/2011 | Wang | |
| 7,989,876 B2 | 8/2011 | Yasuda | |
| 2002/0106536 A1 | 8/2002 | Lee et al. | |
| 2004/0004247 A1 | 1/2004 | Forbes et al. | |
| 2004/0032762 A1 * | 2/2004 | Blanchard | 365/159 |
| 2004/0224459 A1 | 11/2004 | Nishikawa | |
| 2004/0248371 A1 * | 12/2004 | Wang | 438/330 |
| 2005/0062098 A1 | 3/2005 | Mahajani et al. | |
| 2005/0153571 A1 | 7/2005 | Senzaki | |
| 2005/0205969 A1 | 9/2005 | Ono et al. | |

(Continued)

FOREIGN PATENT DOCUMENTS

CN 1783 457 A 6/2006

OTHER PUBLICATIONS

Eitan, B., et al., "4-bit per Cell NROM Reliability," IEEE, 2005, pp. 539-542.

(Continued)

*Primary Examiner* — Allison P Bernstein
(74) *Attorney, Agent, or Firm* — Slater & Matsil, L.L.P.

(57) ABSTRACT

A flash memory cell includes a substrate, a blocking layer over the substrate, a floating gate over the blocking layer, a retention layer over the floating gate, a control gate over the retention layer, a tunneling layer over the control gate, a top gate over the tunneling layer, and a voltage source electrically coupled between the top gate and the control gate. Various charge tunneling mechanisms may be used for charges to tunnel through the retention layer.

20 Claims, 6 Drawing Sheets

U.S. PATENT DOCUMENTS

| | | |
|---|---|---|
| 2006/0044915 A1 | 3/2006 | Park et al. |
| 2006/0097306 A1 | 5/2006 | Kim et al. |
| 2006/0261401 A1 | 11/2006 | Bhattacharyya |
| 2006/0273370 A1 | 12/2006 | Forbes |
| 2007/0132010 A1 | 6/2007 | Bhattacharyya |
| 2007/0187730 A1 | 8/2007 | Park et al. |
| 2008/0067577 A1 | 3/2008 | Wang et al. |

OTHER PUBLICATIONS

Green, M. L., et al., "Ultrathin (<4 nm) $SiO_2$ and Si—O—N gate dielectric layers for silicon microelectonics: Understanding the processing, structure, and physical and electrical limits," Journal of Applied Physics, vol. 90, No. 5, Sep. 1, 2001, 2001 American Institute of Physics, pp. 2057-2121.

Shappir, A., et al., "NROM Window Sensing for 2 and 4-bits per cell Products," IEEE, 2006, pp. 68-69.

Yokoyama, S., et al., "Characterization of plasma-enhanced chemically-vapor-deposited silicon-rich silicon dioxide/thermal silicon dioxide dual dielectric systems," Journal of Applied Physics, vol. 54, No. 12, Dec. 1983, 1983 American Institute of Physics, pp. 7058-7065.

Goano, M., et al., "Band Structure Nonlocal Pseudopotential Calculation of the III-Nitride Wurtzite Phase Materials System. Part II. Ternary Alloys $Al_xGa_{1-x}N$, $In_xGa_{1-x}N$, and $In_xAl_{1-x}N$," Journal of Applied Physics, American Institute of Physics, Dec. 1, 2000, pp. 6476-6482, vol. 88, No. 11.

Pierret, R.F.; "Advanced Semiconductor Fundamentals," vol. IV, Second Edition; 1989; 2 pages.

Neamen, D.A.; "Semiconductor Physics and Devices"; Appendix B: System of Units, Conversion Factors, and General Constants; 1992; 4 pages.

Neamen, D.A.; "Semiconductor Physics and Devices"; 1992; 10 pages.

\* cited by examiner

PROGRAM/ERASE SCHEMES FOR FLOATING GATE MEMORY CELLS

TECHNICAL FIELD

This invention relates generally to semiconductor devices, and more particularly to memory cells, and even more particularly to structure and operation methods of flash memory cells.

BACKGROUND

Flash memories have become increasingly popular in recent years. A typical flash memory comprises a memory array having a large number of flash memory cells arranged in blocks. One of the most commonly known flash memories is the one-transistor flash memory, wherein each of the memory cells is fabricated as a field-effect transistor having a control gate and a floating gate. The floating gate is capable of holding charges and is separated from source and drain regions contained in a substrate by a layer of thin oxide (tunneling oxide). Each of the memory cells can be electrically charged by injecting electrons from the drain region through the tunneling oxide layer onto the floating gate. The charges can be removed from the floating gate by tunneling the electrons to the substrate through the tunneling oxide layer during an erase operation. Thus, the data in a memory cell is determined by the presence or absence of charges in the floating gate.

In current state-of-the-art non-volatile memories, high voltage (typically ranging from 9V to 20V) is typically used in cell operations (e.g., erase and program operations) in order to achieve desired memory states. Infrastructure for on-chip high voltage generation is thus essential to support the memory cell operations and has become an essential block in non-volatile memories and products. The infrastructure involves separate sets of transistors used for handling high voltages and typically adds at least five extra masks to a conventional CMOS technology. Therefore, it complicates the process technology for non-volatile memories.

Another issue on the high voltage infrastructure is its scalability along new generation technology. The high voltage is found un-scalable or difficult to be scaled due to the physics employed in memory cell operation. In contrast, the operating voltage for logic circuits has been continuously scaled down during the past decades along with the scaling of the minimum geometry of CMOS technology. An increasingly larger gap between voltages operating the logic circuits and the memory cells is observed. The issue is more pronounced and aggravated as CMOS technology is scaled beyond 0.25 μm generation. As a result, a larger overhead, in terms of the area occupied by the high voltage circuitry, is often seen in newer generation memory products (in both stand-alone and embedded non-volatile memory products). The scaling limits for high voltage circuitry further imposes constraints on the scaling of the minimum feature size for high-voltage transistors. Often, the same sets of design rules for high-voltage transistors are used from one generation of products to the next. Furthermore, the high voltage operation introduces more issues in product functionality and reliability area.

U.S. Pat. No. 6,958,513 discusses a flash memory cell capable of operating under low operation voltages, which may be, for example, as low as about 5 volts. The structure of the flash memory cell is illustrated in FIG. 1, which includes a floating gate 2 formed in a well region 4, a control gate 6 over floating gate 2, and a top poly gate 8 over control gate 6. The top poly gate 8 and control gate 6 are separated by a first insulator 10, and control gate 6 and floating gate 2 are separated by a second insulator 12. In a program operation, a negative bias is applied to top poly gate 8 with respect to control gate 6, and thus electrons are injected into control gate 6 from top poly gate 8. The second insulator 12 has a conduction band level lower than the energy level of the electrons, and thus the electrons are ballistic-injected into floating gate 2, which acts as the storage layer of the flash memory cell. In an erase operation, a positive bias is applied to top poly gate 8 with respect to control gate 6, and thus the holes are injected into control gate 6 from top poly gate 8. Second insulator 12 has a valence band lower than the energy level of the holes, and thus the holes are ballistic-injected into floating gate 2. The operation voltages of the above-discussed flash memory cell are far lower than other commonly used flash memory cells. However, to achieve ballistic tunneling through second insulator 12, the voltage applied between control gate 6 and top poly 8 is preferably high in order to increase the energy levels of electrons and holes to surmount the respective conduction band and valence band.

Ideally, the operation voltages of flash memory cells are desired to be the same as operation voltages of core integrated circuits. Although this is still a hard-to-reach target currently, it is preferable to lower operation voltages of flash memory cells as much as possible. New methods for further lowering operation voltages are thus needed.

SUMMARY OF THE INVENTION

In accordance with one aspect of the present invention, a semiconductor device includes a substrate, a blocking layer over the substrate, a floating gate over the blocking layer, a retention layer over the floating gate, a control gate over the retention layer, a tunneling layer over a control gate, a top gate over the tunneling layer, and a voltage source electrically coupled between the top gate and the control gate, wherein electrons generated by the voltage source have an energy level of lower than a conduction band of the retention layer.

In accordance with another aspect of the present invention, a semiconductor device includes a substrate, a blocking layer over the substrate, a floating gate over the blocking layer, wherein the floating gate comprises a dielectric material, a retention layer over the floating gate, a control gate over the retention layer, a tunneling layer over the control gate, and a top gate over the tunneling layer.

In accordance with yet another aspect of the present invention, a method for forming and operating a semiconductor device includes forming a flash memory cell comprising providing a substrate, forming a blocking layer over the substrate, forming a floating gate over the blocking layer, forming a retention layer over the floating gate, forming a control gate over the retention layer, forming a tunneling layer over the control gate, and forming a top gate over the tunneling layer. The method further includes programming the flash memory cell by applying a negative bias voltage between the top gate and the control gate and erasing the flash memory cell by applying a positive bias voltage between the top gate and the control gate, wherein each of the programming and erasing steps comprise a non-ballistic mechanism for charges to tunnel through the retention layer.

In accordance with yet another aspect of the present invention, a method for forming a semiconductor device includes providing a substrate, forming a blocking layer over the substrate, forming a floating gate over the blocking layer, forming a retention layer over the floating gate, forming a control gate over the retention layer, forming a tunneling layer over the control gate, forming a top gate over the tunneling layer, and connecting a voltage source between the top gate and the control gate, wherein electrons generated by the voltage source have an energy level of lower than a conduction band of the retention layer.

In accordance with yet another aspect of the present invention, a method for forming a semiconductor device includes providing a substrate, forming a blocking layer over the substrate, forming a floating gate over the blocking layer wherein the floating gate comprises a dielectric material, forming a retention layer over the floating gate, forming a control gate over the retention layer, forming a tunneling layer over the control gate, and forming a top gate over the tunneling layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
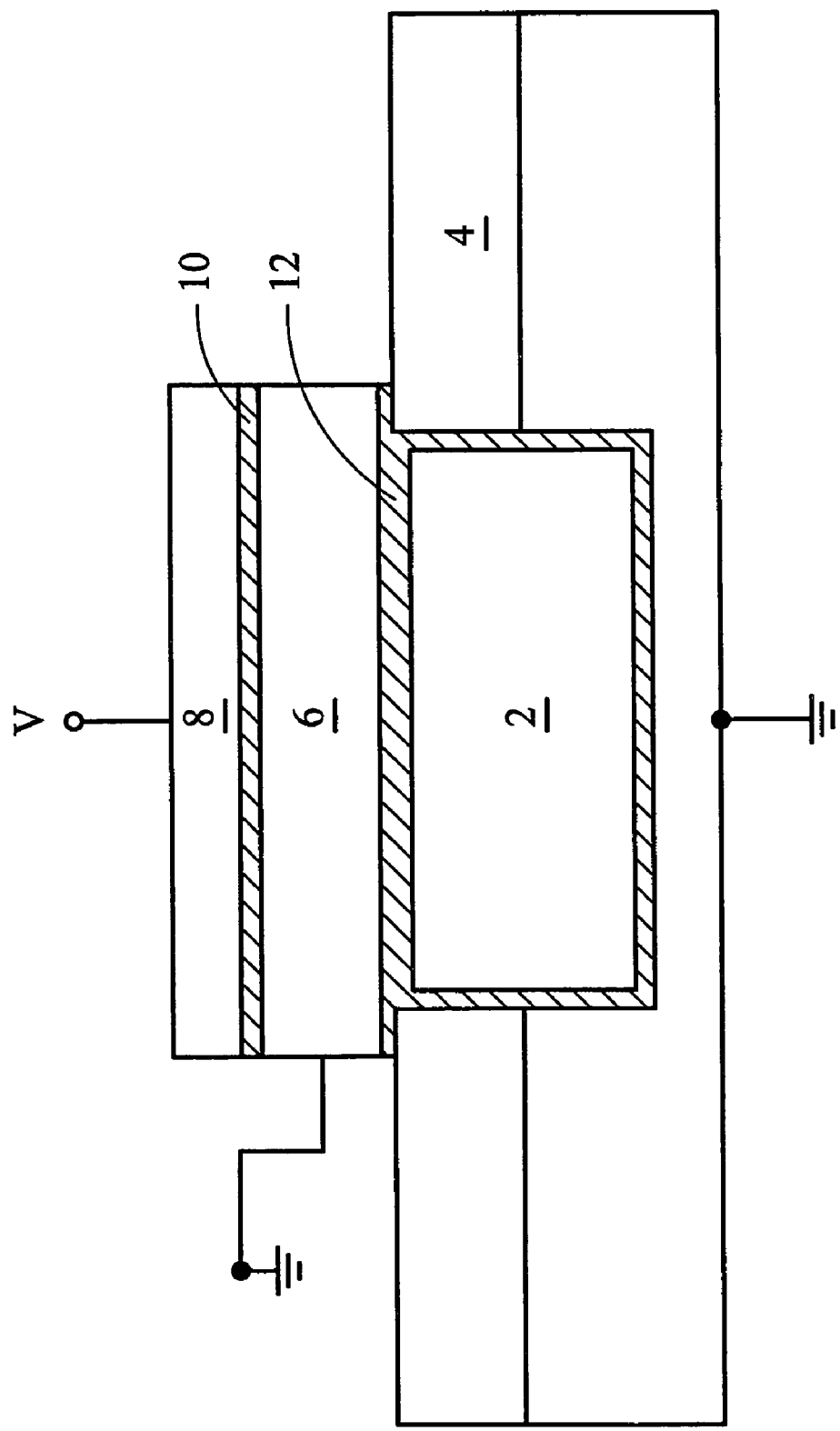
FIG. 1 illustrates a conventional flash memory cell.
Figure 2:
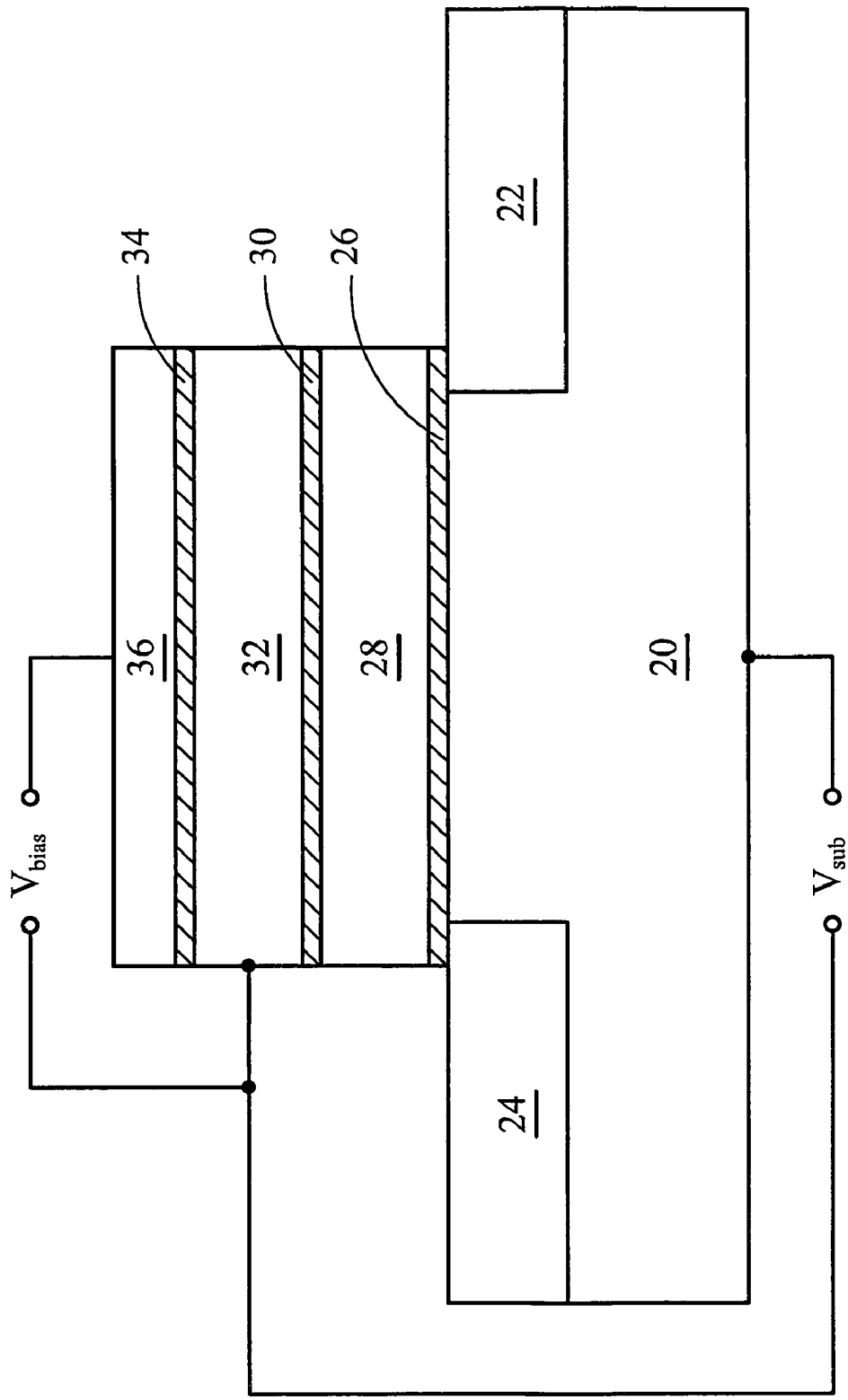
FIG. 2 illustrates a cross-sectional view of a preferred flash memory cell embodiment.

FIG. 2 illustrates a preferred embodiment of the present invention, wherein a flash memory cell is formed at a top surface of a substrate 20. In one embodiment, substrate 20 is formed of a bulk material such as silicon or silicon germanium. In alternative embodiments, substrate 20 has a silicon-on-insulator (SOI) structure. Substrate 20 may be lightly doped with a p-type or an n-type impurity. A drain region 22 and a source region 24, which may include either p-type or n-type impurities, are formed in substrate 20.

A gate stack is formed on substrate 20, which includes a blocking layer 26, a floating gate 28, a retention layer 30, a control gate 32, a tunneling layer 34 and a top gate 36. Blocking layer 26 is formed on substrate 20. Preferably, blocking layer 26 has a low leakage of charges. Accordingly, blocking layer 26 preferably has a high conduction band, so that the barrier height between the conduction band of the blocking layer 26 and the conduction band of substrate 20 is high, preferably greater than about 3.1 eV. Blocking layer 26 is preferably formed of a high-k dielectric material, such as AlLaO$_3$, HfAlO$_3$, HfO$_2$, Ta$_2$O$_5$, Al$_2$O$_3$, ZrO$_2$, TiO$_2$, SrTiO$_3$, and combinations thereof. The k value of blocking layer 26 is preferably greater than about 3.9, and more preferably greater than about 9.

Floating gate 28 is formed on blocking layer 26. Floating gate 28 is preferably a dielectric layer with a high trap density. In the preferred embodiment, floating gate 28 comprises aluminum nitride (AlN), which may be deposited using physical vapor deposition (PVD) or sputter. An aluminum target may be used for the PVD or sputtering, during which nitrogen is preferably introduced as a reactive gas. In an exemplary embodiment for forming AlN, the reactive gas includes nitrogen having a flow rate of about 25 sccm and argon having a flow rate of about 5 sccm. In other embodiments, floating gate 28 may include other high-k dielectric materials including oxides, nitrides and oxynitrides, such as Si$_3$N$_4$, Al$_2$O$_3$, HfO$_2$, HfON, ZrON, and combinations thereof. An advantageous feature of using AlN in floating gate 28 is that AlN has a conduction band lower than the conduction band of conventionally used Si$_3$N$_4$, thus the band discontinuity between floating gate 28 and the subsequently formed control gate 32 is lowered, resulting in a reduced leakage for charges stored in floating gate 28.

In more preferred embodiments, floating gate 28 further comprises Ga or GaN in addition to AlN, forming AlGaN. An advantageous feature of GaN is its negative band alignment to silicon, meaning that the conduction band of GaN is not only lower than that of Si$_3$N$_4$, but also lower than that of silicon. A further advantageous feature is that GaN has a high valence band, thus the resulting valence band of AlGaN is increased compared to that of AlN. The low conduction band of AlGaN results in further reduction in the leakage, and the high valence band results in the reduction of over-erase.

AlGaN is preferably formed using metal organic chemical vapor deposition (MOCVD) at a temperature of about 550° C. Preferably, the composition of aluminum, gallium and nitride is adjusted to achieve a desired conduction band and valence band. In an exemplary embodiment, floating gate 28 comprises between about 1 percent and about 99 percent aluminum and between about 99 percent and about 1 percent gallium. The preferred thickness of floating gate 28 is greater than about 10 Å, and more preferably between about 80 Å and about 100 Å.

In other embodiments, floating gate 28 comprises conductive materials such as doped polysilicon, metal silicides, metal nitrides, and the like. In yet other embodiments, floating gate 28 includes nano crystal with nano crystal islands isolated by the dielectric materials.

Retention layer 30, which preferably includes oxides such as silicon oxide, is formed on floating gate 28. Alternatively, nitrides, oxynitrides, high-k materials such as AlLaO$_3$, HfAlO$_3$, HfO$_2$, Ta$_2$O$_5$, Al$_2$O$_3$, ZrO$_2$, TiO$_2$, SrTiO$_3$, and combinations thereof, may also be used. The retention layer 30 may also be a composite layer including more than one layer, each layer comprising one or more of the above-listed materials. More details regarding retention layer 30 will be provided in subsequent paragraphs.

Control gate 32 is formed on retention layer 30. Control gate 32 preferably includes conductive materials, such as polysilicon doped with n-type impurities, polysilicon doped with p-type impurities, metals, metal silicides, metal nitrides, and combinations thereof. An electrical connection is made to control gate 32 in order to apply a voltage.

Residing on control gate 32 is tunneling layer 34. In the preferred embodiment, tunneling layer 34 comprises an oxide layer, such as a SiO$_2$ layer, on a nitride layer. In other embodiments, tunneling layer 34 is formed of a SiO$_2$ layer. In yet other embodiments, tunneling layer 34 comprises nitrides, oxynitrides, high-k dielectric materials such as AlLaO$_3$, HfAlO$_3$, HfO$_2$, Ta$_2$O$_5$, Al$_2$O$_3$, ZrO$_2$, TiO$_2$, SrTiO$_3$, and combinations thereof.

Top gate 36 is located on tunneling layer 34. In the preferred embodiment, top gate 36 comprises polysilicon doped with n-type impurities. In other embodiments, top gate 36 comprises polysilicon doped with p-type impurities. In yet other embodiments, top gate 36 comprises metals, metal suicides, metal nitrides, and combinations thereof.

Figure 3A:
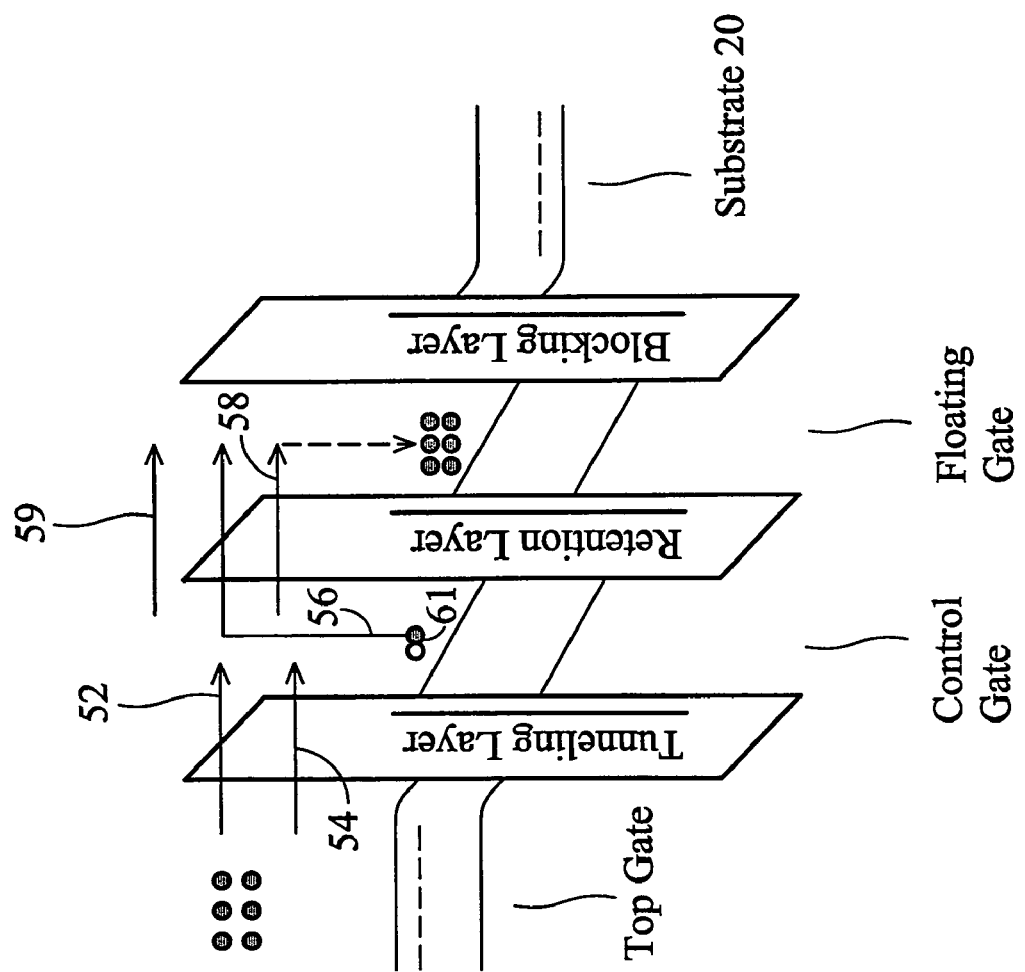
FIG. 3A illustrates an energy band diagram of a program operation, wherein a direct tunneling and a ballistic injection of electrons are shown.
Figure 3B:
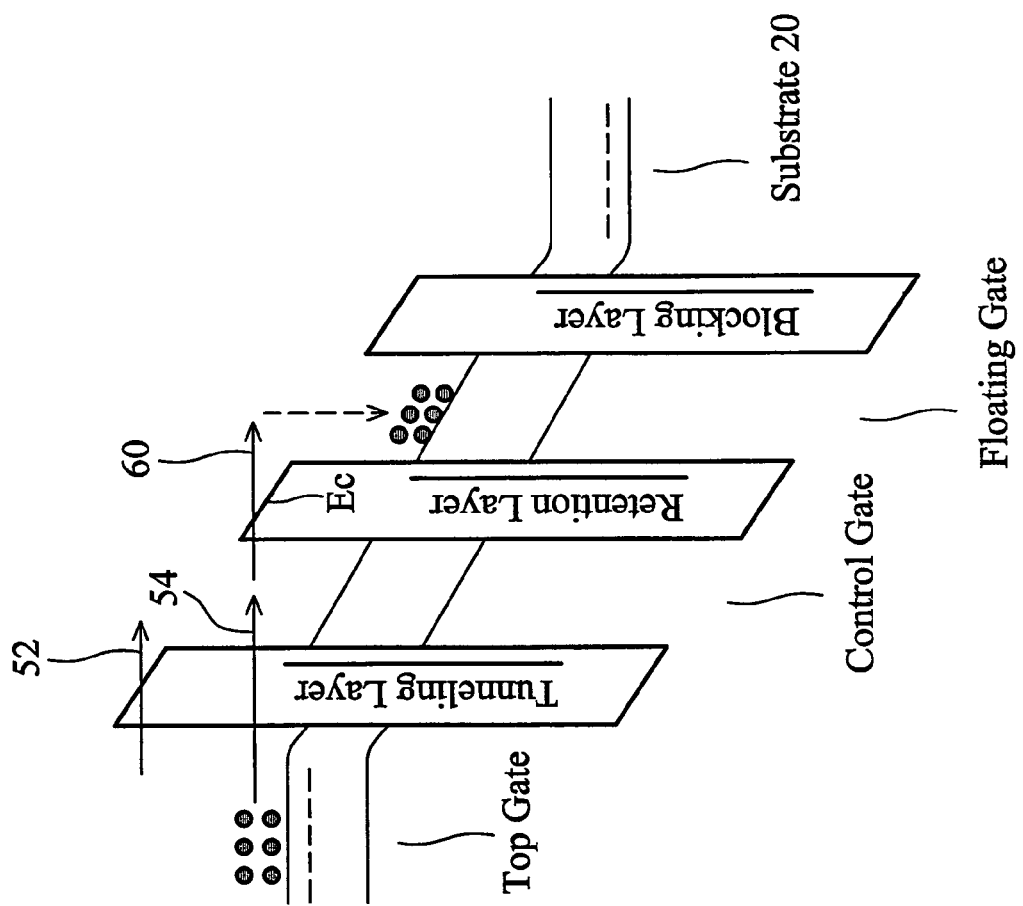
FIG. 3B illustrates an energy band diagram of a program operation, wherein electrons tunnel through a retention layer by Fowler-Nordheim tunneling.

An energy band diagram of a program operation is schematically illustrated in FIGS. 3A and 3B, during which a negative bias voltage Vbias (refer to FIG. 2) is applied to top gate 36 with respect to control gate 32. Control gate 32 may be grounded or connected to a positive or negative voltage potential. In an exemplary embodiment, top gate 36 is applied with a voltage Vbias of between about −2V and about −10V, while control gate 32 is grounded. Substrate 20 is grounded, or may optionally be connected to a voltage potential, for example, between about 0V and about 6V, which is preferably higher than the voltage potential at control gate 32.

Referring to FIG. 3A, in the preferred embodiment, top gate 36 comprises polysilicon doped with an n-type impurity, and thus the majority of carriers are electrons located in conduction bands. When the negative bias voltage Vbias is applied to top gate 36, electrons tunnel through tunneling layer 34, either by Fowler-Nordheim (FN) tunneling, which is symbolized by an arrow 52, or by direct tunneling, which is symbolized by an arrow 54. It is noted that since silicon has a band gap of about 1.12 eV, electrons ejected from conduction bands of silicon will have a higher energy level than electrons ejected from p-type doped polysilicon, with an energy difference of at least 1.12 eV. Therefore, a lower bias voltage (with a difference of 1.12V or more) is needed with an n-type doped top gate 36 than with a p-type doped top gate 36. Please note that if the control gate and substrate 20 are both grounded, the bands of retention layer 30, floating gate 28, and blocking layer 26 will be flat.

After tunneling through tunneling layer 34, electrons will be injected into floating gate 28. In the preferred embodiment, the electron injection may be performed through mechanisms including direct tunneling, FN tunneling, ballistic injection, hot electron injection, and combinations thereof. FIG. 3A illustrates a direct tunneling of electrons (arrow 58) through retention layer 30. In this embodiment, retention layer 30 is preferably thin for direct tunneling to occur, wherein the thickness is preferably less than about 30 Å. In addition, to reduce leakage current and to increase data retention time, retention layer 30 preferably has a high conduction band level, hence a high band gap. This will likely cause the energy level of electrons to be lower than the conduction band of the retention layer 30, and thus the tunneling mechanism of electrons will include direct tunneling. In one embodiment, retention layer 30 is formed of $SiO_2$. In other embodiments, impurities, such as nitrogen and additional silicon, are added into retention layer 30 to reduce the conduction bands and valence bands. In yet other embodiments, retention layer 30 may be formed of materials having a similar, or even greater, band gap than $SiO_2$, such as $Al_2O_3$, $BeO$, $CaF_2$, and $LiF$, and the like. It should be appreciated that in the preferred embodiment floating gate 28 is formed of dielectric materials, therefore, even when retention layer 30 is very thin, under normal storage conditions wherein no voltage is applied, electrons stored in floating gate 28 are less likely to leak out, and thus the data retention time is increased.

If a ballistic electron injection mechanism is preferred, then either the magnitude of bias voltage Vbias is increased or the band gap of retention layer 30 is lowered. An example of ballistic injection is symbolized by an arrow 59 in FIG. 3A. In the preferred embodiment, the lowering of the energy band gap of retention layer 30 is achieved by adding impurities, such as nitrogen and/or silicon into $SiO_2$. Alternatively, dielectric materials with lower band gaps such as SiN, SiON, Si-rich oxide, and high-k dielectric materials may be used. Further, retention layer may include $SiO_2$ silicon and/or nitrogen doped in to reduce band gap. As a result of either increased bias voltage Vbias or lowered band gap, the energy level of the electrons will be higher than the conduction band of retention layer 30, and thus ballistic injection will occur.

Ballistic injection of charges has a very high injection efficiency, sometimes over 20 percent. However, higher operation voltages are needed to increase the energies of electrons to a level higher than the conduction band of retention layer 30. To achieve a better balance between the requirements of lowering operation voltages and increasing charge injection efficiency, other injection mechanisms may be used and may be combined with ballistic injection. In one embodiment, the injection of electrons into floating gate 28 may also be performed by hot electron injection. This can be achieved by increasing bias voltage Vbias. FIG. 3A schematically illustrates the generation of a hot electron/hole pair (refer to hole-electron pair 61). The hot electron is then injected (symbolized by an arrow 56) into floating gate 28. By adjusting the bias voltage Vbias and the thickness and band gaps of retention layer 30, the percentages of electrons tunneled using different mechanisms can be adjusted.

FIG. 3B illustrates a FN tunneling of electrons through retention layer 30. In this embodiment, retention layer 30 is preferably thicker than in FIG. 3A, so that electrons are less likely to tunnel through it directly. For example, the thickness of retention layer 30 may be greater than about 30 Å to achieve FN tunneling. In a first embodiment, to assist the FN mechanism, a positive bias voltage Vsub (refer to FIG. 2) is applied to substrate 20, wherein the positive bias voltage Vsub is with respect to control gate 32. The positive bias voltage Vsub is preferably between about 0V and about 6V. As a result of the bias voltage Vsub, electrons in control gate 32 tunnel through retention layer 30 by FN tunneling, as is symbolized by arrow 60. In this embodiment, although an additional voltage Vsub needs to be applied to substrate 20, the voltage applied to top gate 36 can be lowered because, without the need for ballistic-injection of electrons into floating gate 28 (or with a smaller percentage of electrons being ballistic-injected because other electrons are using FN tunneling or other mechanisms), the energy level of electrons may be close to, or even a little lower than, the conduction band of the retention layer 30. In a second embodiment, for FN tunneling of electrons to occur, control gate 32 is connected to a negative voltage potential, and substrate 20 can be either grounded or connected to a positive voltage potential.

In an alternative embodiment, a tunneling layer 34 may adopt a material having a low conduction band, hence a low band gap. The band gap of tunneling layer 34 may be lower than the band gap of retention layer 30 and/or the band gap of $SiO_2$. In an exemplary embodiment, tunneling layer 34 comprises silicon nitride, Si-rich oxide, high-k dielectric materials, and the like. As a result of the lowering of the conduction band of tunneling layer 34, bias voltage Vbias can be lowered without affecting the tunneling of electrons through tunneling layer 34. A consequence of a reduced bias voltage Vbias is the reduction of the energy level of electrons. However, the reduction of the energy level can be compensated for by either the additional voltage Vsub or the FN/direct tunneling of a portion of the electrons.

It is to be realized, however, that during any program or erase operation, several mechanisms may co-exist. Throughout the description, when a mechanism is referred to, the percentage of charges using the mechanism is at least noticeable, for example, is greater than about one percent of the total charges injected. In more preferred embodiments of the present invention, the injection of electrons through retention layer 30 uses combined mechanisms, wherein each of the mechanisms has a noticeable percentage of charges. For example, some electrons having high energies use a ballistic mechanism, while some electrons having lower energy levels use direct tunneling or FN tunneling. An advantageous feature of the adjustment of the electron mechanisms is that various design factors such as low operation voltages, long data retention time, etc., can be balanced to suit different design requirements.

Figure 4A:
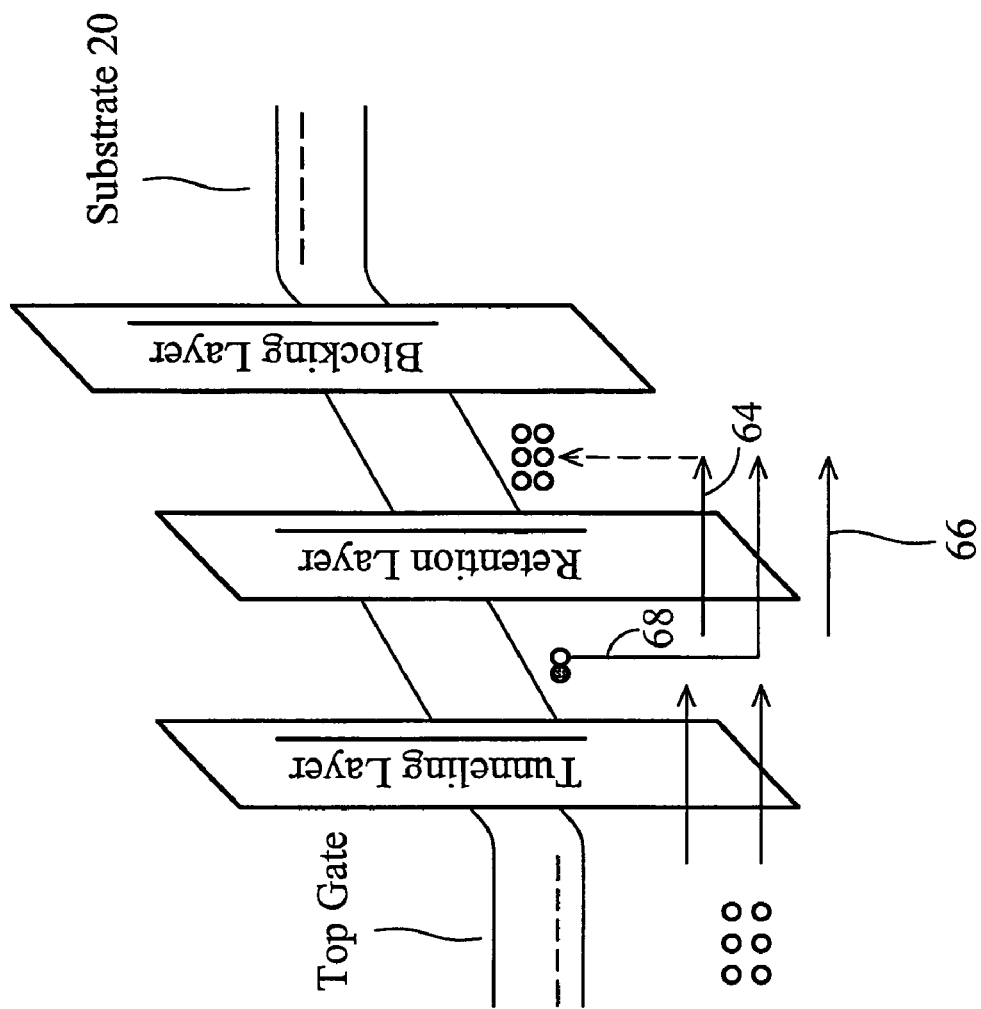
FIG. 4A illustrates an energy band diagram of an erase operation, wherein a direct tunneling and a ballistic injection of electrons are shown.
Figure 4B:
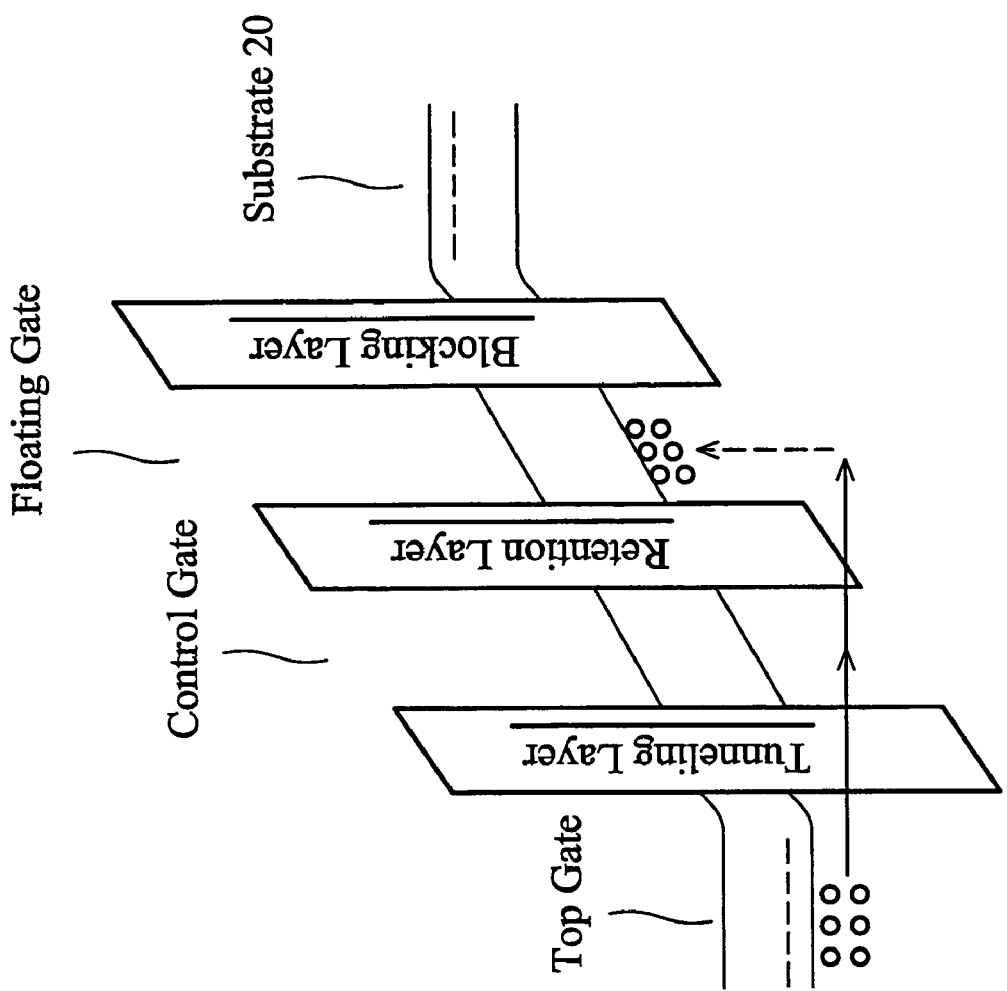
FIG. 4B illustrates an energy band diagram of an erase operation, wherein holes tunnel through the retention layer by Fowler-Nordheim tunneling.

FIGS. 4A and 4B schematically illustrate energy band diagrams of erase operations. Preferably, a positive bias voltage Vbias is applied to top gate 36 with respect to control gate 32. In an exemplary embodiment, Vbias is between about 4V and about 12V, and control gate 32 is grounded. Substrate 20 is grounded or optionally may be connected to a negative voltage Vsub (refer to FIG. 2), for example, between about 0V and about −6V. Similar to the program operations, erase operations can also be performed using mechanisms including direct tunneling, FN tunneling, ballistic injection, hot hole injection, and combinations thereof.

FIG. 4A illustrates a direct tunneling of holes (symbolized by arrow 64) through retention layer 30, wherein retention layer 30 is preferably thin and has a high band gap. Please note that if the control gate and substrate 20 are both grounded, the bands of retention layer 30, floating gate 28, and blocking layer 26 will be flat. Arrows 66, on the other hand, symbolize ballistic hole injection into floating gate 28. Ballistic hole injection may be achieved by either increasing the bias voltage Vias applied on top gate 36 or reducing the band gap of retention layer 30. As discussed in preceding paragraphs, adding impurities, such as nitrogen and/or silicon, may reduce the band gap of retention layer 30 formed of $SiO_2$, hence reducing the energy level of its valence band. Alternatively, other materials having lower band gaps may be adopted.

The injection of holes into floating gate 28 may also use a hot hole injection mechanism, as is symbolized by arrow 68. This can be achieved by increasing the positive bias voltage Vbias applied on top gate 36.

FIG. 4B illustrates a FN tunneling of holes (arrow 56) through retention layer 30. In this embodiment, since retention layer 30 is thicker than in FIG. 4A, to assist the FN tunneling, a negative bias voltage Vsub is applied between substrate 20 and control gate 32 with substrate 20 having a lower voltage potential. The negative bias voltage Vsub is preferably between about 0V and about −6V. Again, by applying the additional voltage Vsub, the voltage applied to top gate 36 can be lowered. Alternatively, FN tunneling of holes can occur when substrate 20 is grounded and control gate 32 is connected to a negative voltage potential.

Similar to the injection of electrons, the injection of holes through retention layer 30 may also use a combination of mechanisms to suit different design requirements.

An advantageous feature of the preferred embodiments of the present invention is that various charge injection mechanisms can be used, either alone or in combination. In addition, the use of dielectric materials in the floating gate reduces the likelihood of charge leakages. Furthermore, the retention layer may either be thicker with a low band gap or thinner with an increased band gap. These factors not only reduce operation voltages, but also increase the data retention time of the memory cells.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate having a planar top surface;
   a blocking layer comprising a dielectric with a k value of >8 disposed on and co-planar with the planar top surface of the substrate and having a top surface, the blocking layer and the substrate each having a conduction band such that the barrier height between the conduction band of the blocking layer and the conduction band of the substrate is greater than about 3.1 eV;
   a floating gate having a bottom surface disposed on the top surface of the blocking layer and over the planar top surface of the substrate;
   a retention layer over the floating gate;
   a control gate over the retention layer;
   a tunneling layer over the control gate;
   a top gate over the tunneling layer; and
   a voltage source electrically coupled between the top gate and the control gate, wherein electrons generated by the voltage source have an energy level of lower than a conduction band of the retention layer.

2. The semiconductor device of claim 1, wherein the top gate comprises polysilicon doped with an n-type impurity.

3. The semiconductor device of claim 1, wherein the floating gate comprises a dielectric material.

4. The semiconductor device of claim 2, wherein the floating gate comprises aluminum nitride (AlN).

5. The semiconductor device of claim 3, wherein the floating gate comprises AlGaN.

6. The semiconductor device of claim 1, wherein the floating gate has a dual phase structure comprising nano crystal islands.

7. The semiconductor device of claim 1, wherein the retention layer comprises $SiO_2$ and is doped with a material selected from the group consisting essentially of nitrogen, silicon, and combinations thereof.

8. The semiconductor device of claim 1, wherein the retention layer has a thickness of less than about 30 Å, and a band gap greater than a band gap of $SiO_2$.

9. The semiconductor device of claim 1, wherein holes generated by the voltage source have an energy level of higher than a valence band of the retention layer.

10. The semiconductor device of claim 1 further comprising an additional voltage source electrically coupled between the control gate and the substrate, wherein the additional voltage source generates an electrical field in a same direction as an electrical field generated by the voltage source.

11. The semiconductor device of claim 1, wherein the tunneling layer has a band gap lower than a band gap of the retention layer.

12. The semiconductor device of claim 1, wherein the tunneling layer comprises $SiO_2$ and is doped with a material selected from the group consisting essentially of nitrogen, silicon, and combinations thereof.

13. A semiconductor device comprising:
- a substrate having a planar top surface;
- a blocking layer comprising a dielectric material having a k value of >8 disposed on and co-planar with the planar top surface of the substrate, the blocking layer and the substrate each having a conduction band such that the barrier height between the conduction band of the blocking layer and the conduction band of the substrate is greater than about 3.1 eV;
- a floating gate over the blocking layer and over the planar top surface of the substrate, wherein the floating gate comprises a dielectric material;
- a retention layer over the floating gate;
- a control gate over the retention layer;
- a tunneling layer over the control gate; and
- a top gate over the tunneling layer.

14. The semiconductor device of claim 13, wherein the top gate comprises polysilicon doped with an n-type impurity.

15. The semiconductor device of claim 13, wherein the floating gate comprises a material selected from the group consisting essentially of AN and AlGaN.

16. The semiconductor device of claim 13, wherein the floating gate has a dual phase structure comprising nano crystal islands.

17. The semiconductor device of claim 13, wherein the retention layer and tunneling layer comprise $SiO_2$, and wherein the retention layer and the tunneling layer are doped with a material selected from the group consisting essentially of nitrogen, silicon, and combinations thereof.

18. The semiconductor device of claim 13 further comprising a power source coupled between the top gate and the control gate, wherein electrons generated by the power source have an energy level of lower than an energy level of a conduction band of the retention layer, and wherein holes generated by the power source have an energy level of lower than an energy level of a valence band of the retention layer.

19. The semiconductor device of claim 18, wherein the tunneling layer has a band gap lower than a band gap of the retention layer.

20. The semiconductor device of claim 18 further comprising an additional power source electrically coupled between the control gate and the substrate, wherein the additional power source generates an electrical field in a same direction as an electrical field generated by the power source.

* * * * *

UNITED STATES PATENT AND TRADEMARK OFFICE
CERTIFICATE OF CORRECTION

PATENT NO. : 8,294,197 B2
APPLICATION NO. : 11/525351
DATED : October 23, 2012
INVENTOR(S) : Wang et al.

Page 1 of 1

It is certified that error appears in the above-identified patent and that said Letters Patent is hereby corrected as shown below:

In Col. 9, line 25, claim 15, delete "AN" and insert --AlN--.

Signed and Sealed this
Ninth Day of April, 2013

Teresa Stanek Rea
*Acting Director of the United States Patent and Trademark Office*